(12) United States Patent
Kim

(10) Patent No.: US 7,881,128 B2
(45) Date of Patent: Feb. 1, 2011

(54) NEGATIVE WORD LINE VOLTAGE GENERATOR FOR SEMICONDUCTOR MEMORY DEVICE

(75) Inventor: Jong-Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 90 days.

(21) Appl. No.: 12/427,832

(22) Filed: Apr. 22, 2009

(65) Prior Publication Data

US 2010/0142288 A1    Jun. 10, 2010

(30) Foreign Application Priority Data

Dec. 4, 2008    (KR) ...................... 10-2008-0122612

(51) Int. Cl.
G11C 7/00    (2006.01)
(52) U.S. Cl. .............................. 365/189.07; 365/189.09
(58) Field of Classification Search ............. 365/210.12
See application file for complete search history.

(56) References Cited

U.S. PATENT DOCUMENTS

| | | | | |
|---|---|---|---|---|
| 5,455,789 A | * | 10/1995 | Nakamura et al. ..... | 365/185.17 |
| 6,104,665 A | * | 8/2000 | Hung et al. ............ | 365/230.06 |
| 6,356,481 B1 | * | 3/2002 | Micheloni et al. ...... | 365/185.23 |
| 7,443,733 B2 | * | 10/2008 | Park ...................... | 365/185.23 |

FOREIGN PATENT DOCUMENTS

KR    1020000045870 A    7/2000

OTHER PUBLICATIONS

Notice of Allowance issued from Korean Intellectual Property Office on May 31, 2010.

* cited by examiner

Primary Examiner—Tan T. Nguyen
(74) Attorney, Agent, or Firm—IP & T Group LLP

(57) ABSTRACT

A negative word line voltage generator for semiconductor memory device includes a comparison unit configured to compare a reference voltage and a feedback voltage and to output a comparison result as an output signal, a pull-down driving unit configured to pull down a negative word line voltage in response to an output signal of the comparison unit, a sub pull-down driving unit configured to pull down a voltage level of the negative word line voltage node additionally during an activation period of a precharge signal, and a feedback unit configured to provide the feedback voltage corresponding to a voltage level of the negative word line voltage.

35 Claims, 2 Drawing Sheets

NEGATIVE WORD LINE VOLTAGE GENERATOR FOR SEMICONDUCTOR MEMORY DEVICE

CROSS-REFERENCE TO RELATED APPLICATION

The present invention claims priority of Korean patent application number 10-2008-0122612, filed on Dec. 4, 2008, the disclosure of which is incorporated by reference herein in its entirety.

BACKGROUND OF THE INVENTION

The present invention relates to a semiconductor memory device, and more particularly, to a negative word line voltage generator for a semiconductor memory device.

A word line for a semiconductor memory device is activated and turns on a cell transistor during an active operation mode, and is inactivated and turns off the cell transistor during a precharge operation mode.

The cell transistor is composed of at least one NMOS transistor of which a gate is coupled to a word line. A negative voltage is used as an inactivation voltage to enhance a turn-off capacity of the NMOS transistor and other characteristics of the NMOS transistor. A negative word line voltage generator for a semiconductor memory device using 'negative word line' technique will be described below.

FIG. 1 is a conventional negative word line voltage generator for a semiconductor memory device.

Referring to FIG. 1, the conventional negative word line voltage generator includes a comparison unit 110, a pull-down driving unit 120, and a feedback unit 130.

The comparison unit 110 compares a division voltage VREF_D of a reference voltage VREF with a feedback voltage FB. The pull-down driving unit 120 pulls down a negative word line voltage VBBW in response to an output signal outputted from an output node NO of the comparison unit 110. The feedback unit 130 provides the feedback voltage FB corresponding to a voltage level of the negative word line voltage VBBW node to the comparison unit 110.

The following is a detailed description about the negative word line voltage generator for the semiconductor memory device.

The comparison unit 110 includes a differential amplifying circuit which receives the division voltage VREF_D of the reference voltage VREF and the feedback voltage FB. A bias block 111 of the differential amplifying circuit provides a sourcing current to a first input block 112 and a second input block 113. The first input block 112 receives the division voltage VREF_D into which the reference voltage VREF is divided in proportion to a resistance value of a first resistor R1 and a second resistor R2. The second input block 113 receives the feedback voltage FB corresponding to a voltage level of the negative word line voltage which is provided from the feedback unit 130. A loading block 114 is coupled between a negative voltage VBB terminal and the first and second input blocks 112 and 113, and is configured as a current mirror.

The pull-down driving unit 120 pulls down the negative word line voltage VBBW in response to the output signal of the comparison unit 110. The pull-down driving unit 120 is coupled between a negative word line voltage VBBW node and the negative voltage VBB terminal and is configured with an NMOS transistor MN3 which is controlled by the output signal of the comparison unit 110.

The feedback unit 130 provides the feedback voltage FB to the second input block 113. The feedback voltage FB is in proportion to a resistance value of a third resistor R3 and a fourth resistor R4 which are coupled in series between a power supply voltage VINT terminal and the negative word line voltage VBBW node.

In the negative word line voltage generator, when the negative word line voltage increases due to an over-load of the negative word line VBBW node, the feedback voltage FB increases, the voltage level of the output signal outputted from the output node NO of the comparison unit 110 increases, and the negative word line voltage is decreased by increasing a pull-down driving capability of the NMOS transistor MN3 of the pull-down driving unit 120 which is controlled by the output signal of the comparison unit 110.

However, due to the limitation of the driving capability of the NMOS transistor MN3, the negative word line voltage may not drop enough. That is, a variation of the negative word line voltage may not be controlled sufficiently.

Accordingly, as the negative word line voltage increases, a leakage current of a cell capacitor coupled to a cell transistor increases, and refresh characteristics and operation reliability of a semiconductor memory device are deteriorated.

SUMMARY OF THE INVENTION

Embodiments of the present invention are directed to providing a negative word line voltage generator for supplying a negative word line voltage stably.

In accordance with an aspect of the present invention, there is provided a negative word line voltage generator for a semiconductor memory device including a comparison unit configured to compare a reference voltage and a feedback voltage and to output a comparison result as an output signal, a pull-down driving unit configured to pull down a negative word line voltage in response to an output signal of the comparison unit, a sub pull-down driving unit configured to pull down a voltage level of the negative word line voltage node additionally during an activation period of a precharge signal, and a feedback unit configured to provide the feedback voltage corresponding to a voltage level of the negative word line voltage.

In accordance with another aspect of the present invention, there is provided a negative word line voltage generator for a semiconductor memory device including a comparison unit configured to compare a reference voltage and a feedback voltage and to output a comparison result as an output signal, a pull-down driving unit configured to pull down a voltage level of a negative word line voltage node in response to an output signal of the comparison unit, and a feedback unit configured to supply the feedback voltage corresponding to a voltage level of the negative word line voltage node, wherein the comparison unit includes a first bias unit configured to supply a first sourcing current, and a second bias unit configured to supply a second sourcing current during an activation period of a precharge signal.

DESCRIPTION OF SPECIFIC EMBODIMENTS

Other objects and advantages of the present invention can be understood by the following description, and become apparent with reference to the embodiments of the present invention.

In general, a logic signal of a circuit is divided into a high logic level H and a low logic level L which may be represented as '1' and '0', respectively. Moreover, a high impedance state Hi-Z may be defined in addition. A P-channel Metal Oxide Semiconductor (PMOS) and an N-channel Metal Oxide Semiconductor (NMOS), which are used in embodiments of the present invention, are Metal Oxide Semiconductor Field-Effect Transistor (MOSFET).

Figure 1:
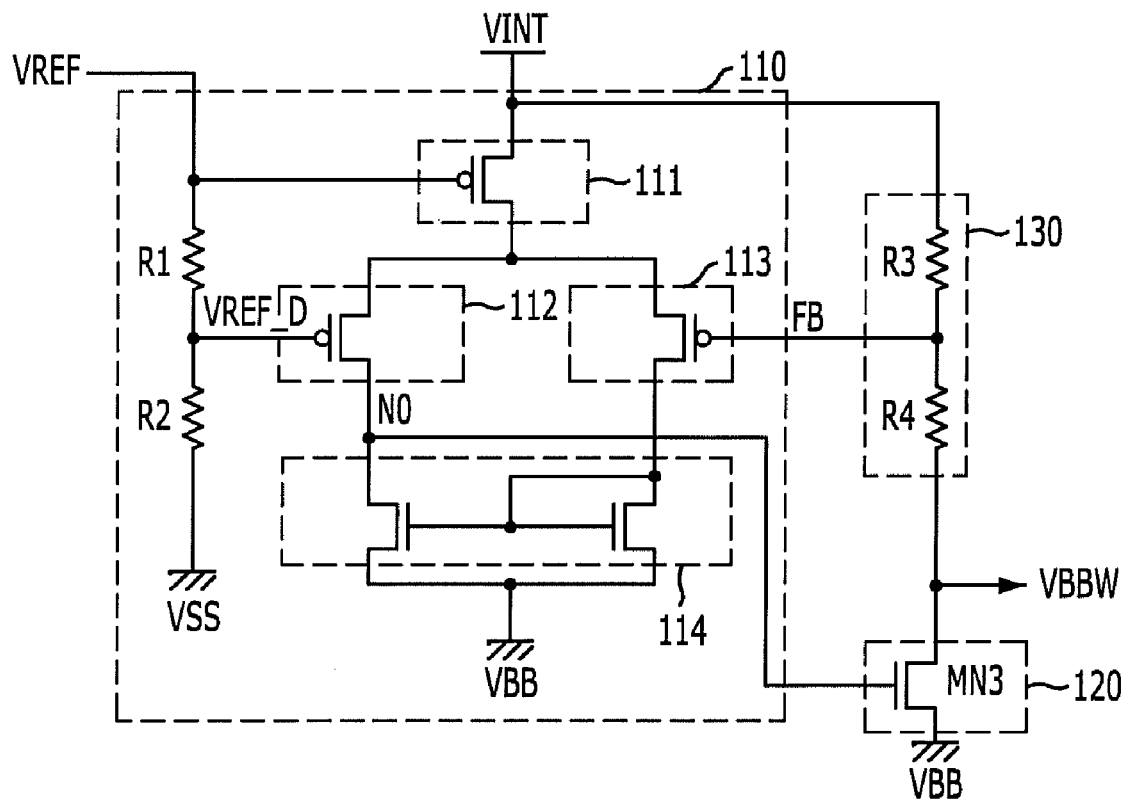
FIG. 1 is a conventional negative word line voltage generator for a semiconductor memory device.
Figure 2:
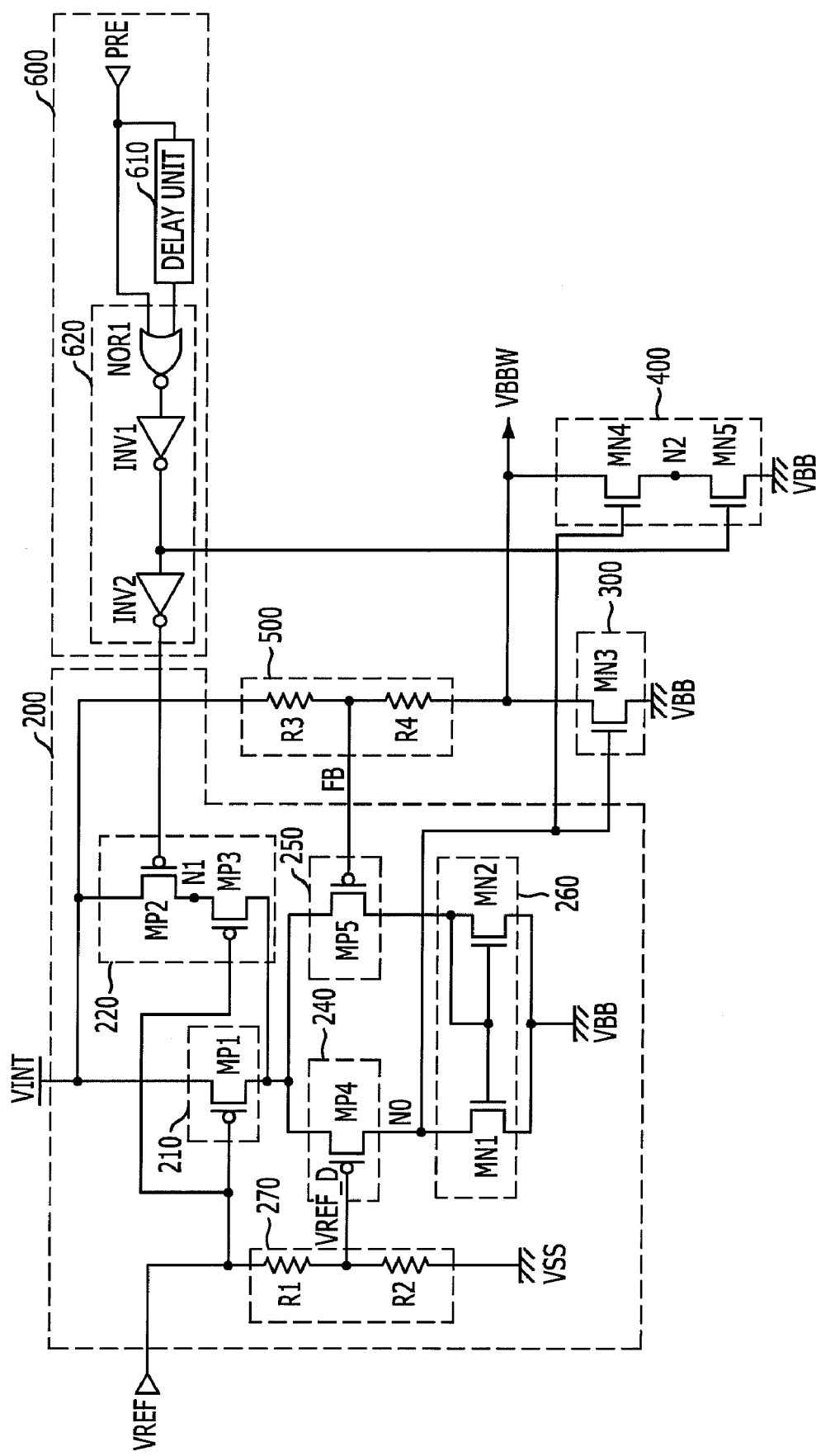
FIG. 2 is a negative word line voltage generator for a semiconductor memory device in accordance with an embodiment of the present invention.

FIG. 2 is a negative word line voltage generator for a semiconductor memory device in accordance with an embodiment of the present invention.

As shown in FIG. 2, the negative word line voltage generator includes a comparison unit 200, a pull-down driving unit 300, a sub pull-down driving unit 400 and a feedback unit 500.

The comparison unit 200 compares a feedback voltage FB with a division voltage VREF_D of a reference voltage VREF. The pull-down driving unit 300 pulls down a negative word line voltage VBBW in response to an output signal outputted from an output node NO of the comparison unit 200. The sub pull-down driving unit 400 pulls down the negative word line voltage VBBW additionally during an activation period of a precharge signal PRE. The feedback unit 500 provides the feedback voltage FB corresponding to the voltage level of the negative word line voltage VBBW node to the comparison unit 200.

Moreover, the negative word line voltage generator may further include a control signal generating unit 600 configured to generate a control signal having an activation period extended than an activation period of the precharge signal PRE by delaying an inactivation time of the precharge signal PRE.

The sub pull-down driving unit 400 pulls down the negative word line voltage VBBW additionally during the activation period of the control signal. That is, the pull-down operation is sustained for a delay time after the precharge activation period. The control signal generating unit 600 includes a delay unit 610 and a logic circuit unit 620. The delay unit 610 delays the precharge signal PRE. The logic circuit unit 620 receives an output signal of the delay unit 610 and the precharge signal PRE. The logic circuit unit 620 includes an NOR gate NOR1 and a first inverter INV1. Moreover, the logic circuit unit 620 may further include a second inverter INV2 for inverting the control signal according to a control object of the control signal.

The following is a detailed description about the negative word line voltage generator for the semiconductor memory device in accordance with an embodiment of the present invention.

The comparison unit 200 is formed of a differential amplifying circuit which receives the feedback voltage FB and the division voltage VREF_D of a reference voltage VREF. The following is a detailed description about the differential amplifying circuit.

A first bias unit 210 of the differential amplifying circuit provides a first sourcing current to a first input unit 240 and a second input unit 250. The first bias unit 210 is coupled between a power supply voltage VINT terminal and the first and second input units 240 and 250, and is formed of a first PMOS transistor MP1 which is controlled by the reference voltage VREF.

A second bias unit 220 of the differential amplifying circuit provides a second sourcing current to the first input unit 240 and the second input unit 250 during an activation period of the control signal outputted from the control signal generating unit 600. The second bias unit 220 is formed of a second PMOS transistor MP2 and a third PMOS transistor MP3. The second PMOS transistor MP2 is coupled between the power supply voltage VINT terminal and a first connection node N1, and is controlled by the control signal outputted from the control signal generating unit 600. The third PMOS transistor MP3 is coupled between the first connection node N1 and the first and second input units 240 and 250, and is controlled by the reference voltage VREF.

The first input unit 240 of the differential amplifying circuit receives a division voltage VREF_D of the reference voltage VREF, which is obtained by dividing the reference voltage VREF with a voltage dividing unit having a plurality of voltage drop elements in proportion to a resistance value of a first resistor R1 and a second resistor R2.

The second input unit 250 receives the feedback voltage FB corresponding to the voltage level of the negative word line voltage VBBW provided from the feedback unit 500.

The first and second input units 240 and 250 are formed of a fourth PMOS transistor MP4 and a fifth PMOS transistor MP5, and receive an input signal through a gate of the first and second input units 240 and 250.

A loading unit 260 of the differential amplifying circuit is formed as a current mirror between a negative voltage VBB terminal and the first and second input units 240 and 250. The current mirror includes a first NMOS transistor MN1 and a second NMOS transistor MN2.

The pull-down driving unit 300 pulls down the negative word line voltage VBBW in response to the output signal outputted from the output node of the comparison unit 200. The pull-down driving unit 300 is coupled between the negative voltage VBB terminal and the negative word line voltage VBBW node, and is formed of a third NMOS transistor MN3 which is controlled by the output signal outputted from the output node NO of the comparison unit 200.

The sub pull-down driving unit 400 pulls down the negative word line voltage VBBW additionally during the activation period of the control signal outputted from the control signal generating unit 600. The sub pull-down driving unit includes a fourth NMOS transistor MN4 and a fifth NMOS transistor MN5. The fourth NMOS transistor MN4 is coupled between the negative word line voltage VBBW node and a second connection node N2, and is controlled by the output signal outputted from the output node NO of the comparison unit 200. The fifth NMOS transistor MN5 is coupled between the second connection node N2 and the negative voltage VBB terminal, and is controlled by the output signal outputted from the control signal generating unit 600.

For reference, in another embodiment of the present invention, an operation period of the sub pull-down driving unit may be controlled by having an additional control signal generating unit.

The feedback unit 500 includes a voltage division block having a third resistor R3 and a fourth resistor R4, which are coupled in series between the power supply voltage VINT terminal and the negative word line voltage VBBW node. The feedback unit 500 provides a feedback voltage to the second input unit 250 of the differential amplifying circuit. The feedback voltage is acquired in proportion to a resistance value of the third resistor R3 and the fourth resistor R4.

For reference, a voltage level of the negative voltage VBB terminal is same as a negative substrate bias voltage. A voltage level of the power supply voltage VINT terminal is same as a core voltage when a cell capacitor has a high level voltage. The reference voltage VREF has a voltage level equal to a half of the voltage level of the core voltage.

In the negative word line voltage generator described above, due to the over-load of the negative word line voltage VBBW node, the feedback voltage FB increases when the negative word line voltage increases.

Accordingly, because the feedback voltage FB inputted to the second input unit 250 of the comparison unit 200 is higher than the division voltage VREF_D inputted to the first input unit 240 of comparison unit 200, a current flowing into the first input unit 240 greater than a current flowing into the second input unit causes a voltage level of the output node NO of the comparison unit 200 to be increased.

The third NMOS transistor MN3 of the pull-down driving unit 300 which is controlled by the output signal outputted from the output node NOD of the comparison unit 200 maintains constantly a voltage level by dropping the voltage level of the negative word line voltage VBBW node because a voltage applied to a gate of the third NMOS transistor MN3 increases and a pull-down driving capability of the third NMOS transistor MN3 increases.

The fourth NMOS transistor MN4 and the fifth NMOS transistor MN5 included in the sub pull-down driving unit 400 pull down the negative word line voltage VBBW additionally during the activation period of the control signal having the activation period extended than the activation period of the precharge signal PRE by delaying the inactivation time of the precharge signal PRE.

If the activation period of the precharge signal PRE is short, the sub pull-down driving unit 400 may be driven for a longer time than the activation period of the precharge signal PRE. That is, the pull-down driving capability of the negative word line voltage VBBW node is improved during the precharge operation period, and although a large load is applied to the negative word line voltage VBBW node, the variation of the negative word line voltage may be controlled enough.

The variation of the negative word line voltage may be controlled at a fast speed by supplying an additional sourcing current through the second bias unit 220 during the precharge operation period so that a response time of the comparison unit is improved. If the activation period of the precharge signal PRE is short, the second bias unit 220 may be maintained for a longer time than the activation period of the precharge signal PRE.

In the negative word line voltage generator in accordance with an embodiment of the present invention, an operation stability and reliability of a semiconductor memory device is improved by improving a voltage driving capability of the negative word line voltage generator and stabilizing a variation of the negative word line voltage. Moreover, the negative word line voltage generator of the present invention minimizes power consumption by improving the current driving capability only during a required operation period.

While the present invention has been described with respect to the specific embodiments, it will be apparent to those skilled in the art that various changes and modifications may be made without departing from the spirit and scope of the invention as defined in the following claims.

For example, a configuration of an active high state and an active low state for indicating the activation state of a signal and a circuit may be changed. Moreover, a configuration of a transistor may be changed to implement the same function. That is, PMOS transistors and NMOS transistors may be replaced by each other, and various transistors may be implemented for the PMOS transistors and NMOS transistors.

Furthermore, a configuration of a logic circuit may be changed to implement the same function. That is, an NOR circuit and an NAND circuit may be implemented by a various combination of a NAND gate, an NOR gate and an inverter.

Especially, in the embodiment of the present invention, although the sub pull-down driving unit 400 for pulling down the negative word line voltage VBBW and the second bias unit 220 for supplying a sourcing current additionally are exemplarily implemented, the negative word line voltage generator may be implemented by selecting one of them.

Moreover, in the embodiment of the present invention, although the control signal generating unit 600 is described as above, the negative word line voltage generator may be implemented by pulling down the negative word line voltage during the precharge operation period without having the control signal generating unit.

Furthermore, the second bias unit 220 may be designed to supply an additional current only during the precharge operation period.

What is claimed is:

1. A negative word line voltage generator for a semiconductor memory device, comprising:
   a comparison unit configured to compare a reference voltage and a feedback voltage and to output a comparison result as an output signal;
   a pull-down driving unit configured to pull down a negative word line voltage in response to an output signal of the comparison unit;
   a sub pull-down driving unit configured to pull down a voltage level of the negative word line voltage node additionally during an activation period of a precharge signal; and
   a feedback unit configured to provide the feedback voltage corresponding to a voltage level of the negative word line voltage.

2. The negative word line voltage generator for a semiconductor memory device of claim 1, wherein the comparison unit includes a differential amplifying circuit configured to receive the reference voltage and the feedback voltage.

3. The negative word line voltage generator for a semiconductor memory device of claim 1, wherein the comparison unit includes a first bias unit configured to supply a first sourcing current, and a second bias unit configured to supply a second sourcing current during the activation period of the precharge signal.

4. The negative word line voltage generator for a semiconductor memory device of claim 3, wherein the first bias unit includes a first transistor coupled to a power supply voltage terminal, the first transistor is configured to be controlled by the reference voltage and supply the first sourcing current.

5. The negative word line voltage generator for a semiconductor memory device of claim 3, wherein the second bias unit includes
   a second transistor configured to be controlled by the precharge signal and the reference voltage, and supply the second sourcing current.

6. The negative word line voltage generator for a semiconductor memory device of claim 3, wherein the comparison unit further includes a first input unit configured to receive a voltage obtained by dividing the reference voltage, and a second input unit configured to receive the feedback voltage corresponding to a voltage level of the negative word line voltage node from the feedback unit.

7. The negative word line voltage generator for a semiconductor memory device of claim 6, wherein the comparison unit further includes a loading unit coupled between the negative voltage terminal and the first and second input units, the loading unit is formed as a current mirror.

8. The negative word line voltage generator for a semiconductor memory device of claim 7, wherein the comparison unit further includes a voltage diving unit configured to divide the reference voltage into the voltage obtained by dividing the reference voltage.

9. The negative word line voltage generator for a semiconductor memory device of claim 8, wherein the voltage dividing unit includes a plurality of voltage drop elements.

10. The negative word line voltage generator for a semiconductor memory device of claim 1, wherein the pull-down driving unit includes coupled between the negative word line voltage node and the negative voltage terminal, the pull-down driving unit is controlled by the output signal of the comparison unit.

11. The negative word line voltage generator for a semiconductor memory device of claim 10, wherein a voltage level of the negative voltage terminal is the same as a negative substrate bias voltage.

12. The negative word line voltage generator for a semiconductor memory device of claim 1, wherein the sub pull-down driving unit is controlled the output signal of the comparison unit and the precharge signal.

13. The negative word line voltage generator for a semiconductor memory device of claim 1, wherein the feedback unit includes a voltage dividing unit coupled between the power supply voltage terminal and the negative word line voltage node.

14. The negative word line voltage generator for a semiconductor memory device of claim 13, the voltage dividing unit includes a plurality of voltage drop elements.

15. The negative word line voltage generator for a semiconductor memory device of claim 1, further comprising:
a control signal generating unit configured to generate a control signal having an activation period extended than an activation period of the precharge signal by delaying the inactivation time of the precharge signal,
wherein the sub pull-down driving unit is configured to pull down the negative word line voltage additionally during the activation period of the control signal.

16. The negative word line voltage generator for a semiconductor memory device of claim 15, wherein the comparison unit includes a first bias unit configured to supply a first sourcing current in response to the reference voltage, and a second bias unit configured to supply a second sourcing current during the activation period of the precharge signal in response to the reference voltage and the control signal outputted from the control signal generating unit.

17. The negative word line voltage generator for a semiconductor memory device of claim 16, wherein the comparison unit further includes a first input unit configured to receive a voltage obtained by dividing the reference voltage, and a second input unit configured to receive the feedback voltage corresponding to a voltage level of the negative word line voltage node from the feedback unit.

18. The negative word line voltage generator for a semiconductor memory device of claim 17, wherein the comparison unit further includes a loading unit coupled between the negative voltage terminal and the first and second input units, the loading unit is formed as a current mirror.

19. The negative word line voltage generator for a semiconductor memory device of claim 15, wherein the pull-down driving unit includes coupled between the negative word line voltage node and the negative voltage terminal, the pull-down driving unit is controlled by the output signal of the comparison unit.

20. The negative word line voltage generator for a semiconductor memory device of claim 19, wherein a voltage level of the negative voltage terminal is the same as a negative substrate bias voltage.

21. The negative word line voltage generator for a semiconductor memory device of claim 15, wherein the sub pull-down driving unit is controlled by the output signal of the comparison unit and the control signal outputted from the control signal generating unit.

22. The negative word line voltage generator for a semiconductor memory device of claim 15, wherein the feedback unit includes a voltage dividing unit coupled between the power supply voltage terminal and the negative word line voltage node.

23. A negative word line voltage generator for a semiconductor memory device, comprising:
a comparison unit configured to compare a reference voltage and a feedback voltage and to output a comparison result as an output signal;
a pull-down driving unit configured to pull down a voltage level of a negative word line voltage node in response to an output signal of the comparison unit; and
a feedback unit configured to supply the feedback voltage corresponding to a voltage level of the negative word line voltage node,
wherein the comparison unit includes a first bias unit configured to supply a first sourcing current, and a second bias unit configured to supply a second sourcing current during an activation period of a precharge signal.

24. The negative word line voltage generator for a semiconductor memory device of claim 23, wherein the comparison unit includes a differential amplifying circuit configured to receive the reference voltage and the feedback voltage.

25. The negative word line voltage generator for a semiconductor memory device of claim 24, wherein the comparison unit further includes a first input unit configured to receive a voltage obtained by dividing the reference voltage, and a second input unit configured to receive the feedback voltage corresponding to a voltage level of the negative word line voltage node from the feedback unit.

26. The negative word line voltage generator for a semiconductor memory device of claim 25, wherein the comparison unit further includes a loading unit coupled between the negative voltage terminal and the first and second input units, the loading unit is formed as a current mirror.

27. The negative word line voltage generator for a semiconductor memory device of claim 26, wherein the comparison unit further includes a voltage diving unit configured to divide the reference voltage into the voltage obtained by dividing the reference voltage.

28. The negative word line voltage generator for a semiconductor memory device of claim 27, wherein the voltage dividing unit includes a plurality of voltage drop elements.

29. The negative word line voltage generator for a semiconductor memory device of claim 23, wherein the first bias unit coupled to a power supply voltage terminal, the first bias unit is configured to be controlled by the reference voltage and supply the first sourcing current.

30. The negative word line voltage generator for a semiconductor memory device of claim 23, wherein the second bias unit is configured to be controlled by the precharge signal and the reference voltage, and supply the second sourcing current.

31. The negative word line voltage generator for a semiconductor memory device of claim 23, wherein the pull-down driving unit includes coupled between the negative word line voltage node and the negative voltage terminal, the pull-down driving unit is controlled by the output signal of the comparison unit.

32. The negative word line voltage generator for a semiconductor memory device of claim 31, wherein a voltage level of the negative voltage terminal is the same as a negative substrate bias voltage.

33. The negative word line voltage generator for a semiconductor memory device of claim 23, wherein the sub pull-down driving unit is configured to be controlled by the output signal of the comparison unit and the precharge signal.

34. The negative word line voltage generator for a semiconductor memory device of claim 23, wherein the feedback unit includes a voltage dividing unit coupled between the power supply voltage terminal and the negative word line voltage node.

35. The negative word line voltage generator for a semiconductor memory device of claim 23, wherein the voltage dividing unit includes a plurality of voltage drop elements.

* * * * *